(12) United States Patent
Kruizinga et al.

(10) Patent No.: US 8,189,174 B2
(45) Date of Patent: May 29, 2012

(54) LITHOGRAPHIC APPARATUS PROVIDED WITH A SWAP BRIDGE

(75) Inventors: Matthias Kruizinga, Herten (NL);
Frank Auer, Valkenswaard (NL);
Fransiscus Mathijs Jacobs, Asten (NL);
Ronnie Herman Anna Hensen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 422 days.

(21) Appl. No.: 12/616,279

(22) Filed: Nov. 11, 2009

(65) Prior Publication Data
US 2010/0128241 A1    May 27, 2010

Related U.S. Application Data

(60) Provisional application No. 61/117,019, filed on Nov. 21, 2008.

(51) Int. Cl.
*G03B 27/58* (2006.01)
*G03B 27/42* (2006.01)
(52) U.S. Cl. .......................................... 355/72; 355/53
(58) Field of Classification Search .................. 355/30, 355/53, 72–77
See application file for complete search history.

(56) References Cited

U.S. PATENT DOCUMENTS

| 6,327,022 | B1 * | 12/2001 | Nishi ............................... 355/53 |
| 7,158,232 | B2 * | 1/2007 | Akutsu et al. ................. 356/400 |
| 7,310,132 | B2 * | 12/2007 | Van Der Schoot et al. ..... 355/72 |
| 2007/0216881 | A1 | 9/2007 | Van Der Schoot et al. |

FOREIGN PATENT DOCUMENTS

| EP | 1713113 A1 | 10/2006 |
| EP | 1933371 A1 | 6/2008 |

OTHER PUBLICATIONS

Search Report in related Singapore patent application No. 200907579-7 dated Dec. 14, 2010.

* cited by examiner

*Primary Examiner* — Hung Henry Nguyen
(74) *Attorney, Agent, or Firm* — Pillsbury Winthrop Shaw Pittman LLP (57) ABSTRACT

A lithographic apparatus includes two stages that are each configured to hold a substrate, wherein each stage is provided with a short stroke module to move a table with a substrate and a long stroke module to move the short stroke module of that stage. The lithographic apparatus includes a swap bridge to couple the stages, and wherein, in use, in a first configuration, the stages are moveable with respect to each other, and wherein, in use, in a second configuration, the stages are coupled via the swap bridge to make a joint movement.

7 Claims, 7 Drawing Sheets

LITHOGRAPHIC APPARATUS PROVIDED WITH A SWAP BRIDGE

CROSS REFERENCE TO RELATED APPLICATIONS

This application claims priority and benefit under 35 U.S.C. §119(e) to U.S. Provisional Patent Application No. 61/117,019, entitled "Lithographic Apparatus Provided With A Swap Bridge", filed on Nov. 21, 2008. The content of that application is incorporated herein in its entirety by reference.

FIELD

The invention relates to a lithographic apparatus including two stages for holding substrates.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus is known from U.S. Pat. No. 7,310,132 B1. In U.S. Pat. No. 7,310,132 B1 a lithographic apparatus is described including two substrate stages. Each substrate stage is provided with a long stroke module and a short stroke module which forms part of the second positioner for moving the substrate. Furthermore, the known lithographic apparatus is provided with a swap bridge in the form of a moveable member. U.S. Pat. No. 7,310,132 B1 describes two main embodiments of the known lithographic apparatus. In a first configuration the substrate stages are moveable with respect to each other, and in a second configuration, the substrate stages are coupled via the swap bridge which is realized by bringing the top surfaces of the substrate stages together by using the moveable member for a joint movement.

In a first embodiment of the known lithographic apparatus, in the first configuration, wherein substrate tables are used in parallel, or preparatory steps are carried out on one of the tables while the other table is being used for exposure, the moveable part of one of the short stroke modules carries the swap bridge. Carrying the swap bridge is undesirable as it may create a dynamical disturbance and therefore a decreased positioning accuracy since the mass of the swap bridge is added to the moveable part of the short stroke module and thus deteriorates its dynamics.

In a second embodiment of the known lithographic apparatus, in the second configuration, wherein the stages are extended and perform concurrent moving, the swap bridge is coupled to the moveable parts of the short stroke modules and to the moveable part of one long stroke module of the stages. This is undesirable because there is a dynamical coupling between the moveable parts of the short stroke and the long stroke modules. As a result, dynamical disturbances from the long stroke module can be transmitted to the short stroke modules.

SUMMARY

In an aspect of the invention, there is provided a lithographic apparatus including a first and a second stage that are each configured to hold a substrate, each of the first and the second stage being provided with a short stroke module configured to move a table with the substrate and a long stroke module configured to move the short stroke module of the stage; a swap bridge configured to couple the first and the second stage, wherein, in use, in a first configuration, the first and the second stage are moveable with respect to each other, and wherein, in a second configuration, the first and the second stage are coupled via the swap bridge to make a joint movement; a bridge holder configured to hold the swap bridge in the first configuration, wherein the bridge holder is dynamically isolated from a moveable part of the short stroke module of the first and the second stage; and a coupler configured to couple the moveable part of the short stroke module of the first and the second stage with the swap bridge such that, in use, in the second configuration, the swap bridge is only coupled with the moveable part of the short stroke module of the first and the second stage.

In this way, dynamical disturbances are reduced effectively both in the first and second configurations. In the first configuration, this reduction is obtained since the bridge holder which is dynamically isolated from the moveable parts of the short stroke modules, holds the swap bridge dynamically isolated from the moveable parts of the short stroke modules such that the mass of the swap bridge is not added to the moveable parts of the short stroke modules and does not deteriorate their dynamics. In the second configuration, this reduction is obtained since the swap bridge is dynamically isolated from the long stroke module such that effectively no disturbances can transmit from the long stroke module to short stroke module.

In an embodiment of the invention, the bridge holder is connected to a stationary part of the lithographic apparatus, for example the projection system or a stationary frame. A benefit is that, in the first configuration, both stages can move without any coupling to the bridge holder and the swap bridge. This yields a better dynamic behavior.

In an embodiment of the invention, the bridge holder is directly or indirectly coupled to the moveable part of one of the long stroke modules. A benefit of this embodiment is that, in the first configuration, the swap bridge is held dynamically isolated from the moveable parts of the short stroke modules and is stored close to the short stroke modules. When changing to the second configuration, the swap bridge can be deployed quickly between the moveable parts of the short stroke modules, which improves the throughput of the lithographic apparatus In an embodiment of the invention, the bridge holder is configured to hold the swap bridge in a first configuration such that the swap bridge is prevented from colliding with another part of the lithographic apparatus. A benefit is that, in the first configuration, the swap bridge can not be damaged by colliding with another part of the lithographic apparatus.

In an embodiment of the invention, the lithographic apparatus is provided with a hinge between the moveable part of the long stroke module and the bridge holder such that the swap bridge can be rotated from the first position to a second position by the hinge.

In an embodiment of the invention, the lithographic apparatus is provided with a bridgehead configured to couple the swap bridge to the moveable part of one of the short stroke modules such that deformations of the short stroke module and/or swap bridge are at least partly isolated from each other. A benefit is that deformation of the swap bridge results in minimal deformation of the short stroke modules and vice versa.

In an embodiment of the invention, the lithographic apparatus is provided with an uncoupler configured to uncouple the swap bridge from the moveable parts of the short stroke modules by moving the moveable parts of the short stroke modules toward each other, the bridge holder being constructed to capture the swap bridge after the swap bridge has been uncoupled. In a normal situation, to uncouple the swap bridge, the moveable parts of the short stroke modules are first lowered to place the swap bridge onto the bridge holder, and then moved away from each other to uncouple the swap bridge. A benefit of the embodiment is that in an exceptional situation in which the moveable parts of the short stroke modules move too close to each other, damage can be prevented by uncoupling the swap bridge.

In an embodiment of the invention, there is provided a device manufacturing method including coupling a first and a second stage with a swap bridge, the first and the second stage being each configured to hold a substrate, each of the first and the second stage being provided with a short stroke module and a long stroke module configured to move the short stroke module of the stage, wherein, in use, in a first configuration, the first and the second stage are moveable with respect to each other, and wherein, in a second configuration, the first and the second stage are coupled via the swap bridge for joint movement; holding the swap bridge with a bridge holder in the first configuration, wherein the bridge holder is dynamically isolated from a moveable part of the short stroke module of the first and the second stage; and coupling the moveable part of the short stroke module of the first and the second stage with the swap bridge such that, in use, in the second configuration, the swap bridge is only coupled with the moveable part of the short stroke module of the first and the second stage.

BRIEF DESCRIPTION OF THE DRAWINGS

Embodiments of the invention will now be described with reference to the accompanying drawings. In these drawings.

DETAILED DESCRIPTION

Figure 1:
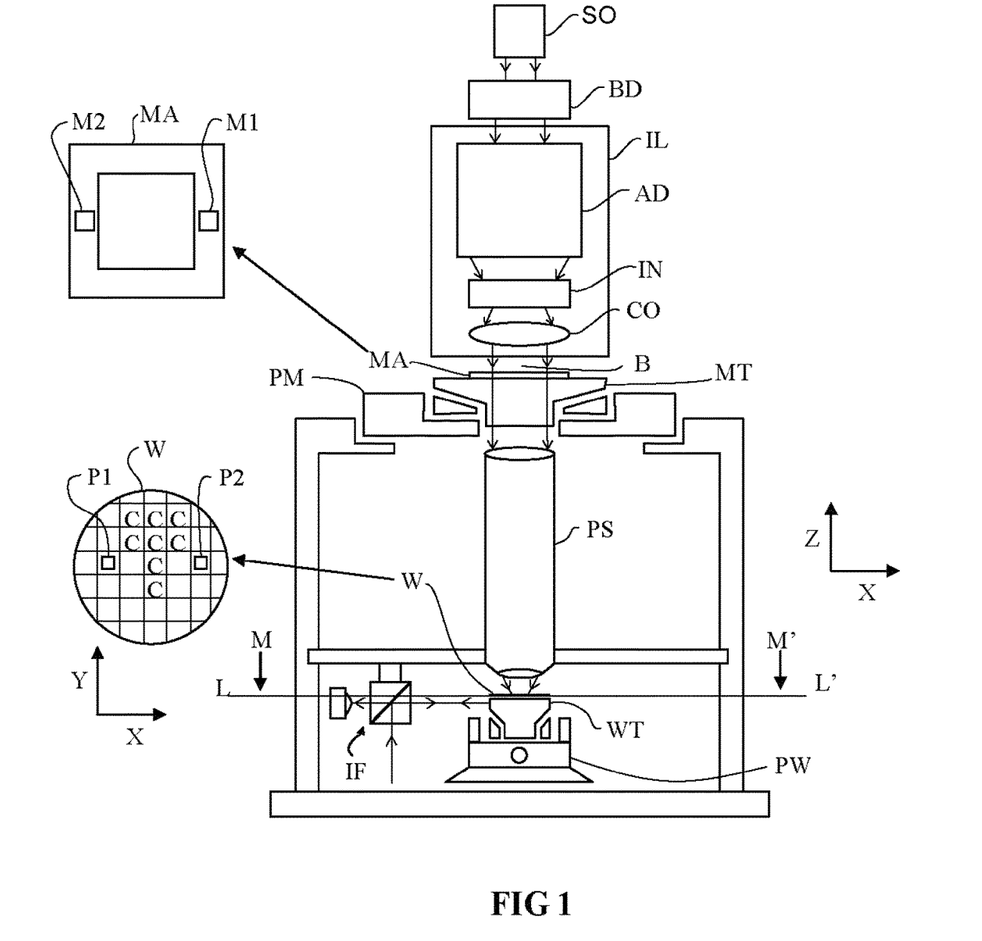
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate.

It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long stroke module (coarse positioning) and a short stroke module (fine positioning), which form part of the first positioner PM. Similarly, movement of the substrate table WT may be realized using a long stroke module and a short stroke module, which forms part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the patterning device (e.g. mask) and the first element of the projection system. Immersion techniques are well known in the art for increasing the numerical aperture of projection systems.

Combinations and/or variations on the above described modes of use or entirely different modes of use may also be employed.

Figure 2:
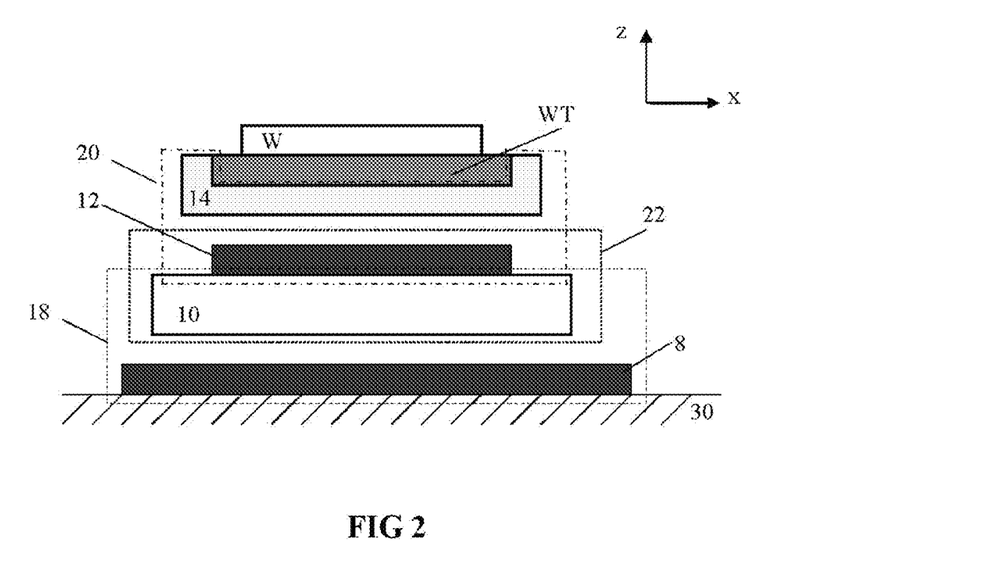
FIG. 2 schematically depicts in a side view a stage of the lithographic apparatus of FIG. 1.

FIG. 2 schematically depicts a stage of the lithographic apparatus of FIG. 1. The long stroke module 18 and the short stroke module 20 each can be divided in a stationary and a moveable part. Each module includes a motor to move the moveable part of the module relative to the stationary part. In FIG. 2, a stage support 30 is depicted, which can be a stone table, used to support the stage. Attached to the stage support 30 is the stationary part 8 of the long stroke module 18. The moveable part 10 of the long stroke module 18 is moveable relative to the stationary part 8. Attached to the moveable part 10 of the long stroke modules 18 is the stationary part 12 of the short stroke module 20. The moveable part 14 of the short stroke module 20 is moveable relative to the stationary part 12. The substrate table WT is attached to the moveable part 14 of the short stroke module 20. The substrate table WT is configured to support a substrate W which is not part of the stage.

The moveable part 10 of the long stroke module 18 and the stationary part 12 of the short stroke module 20 are referred to hereinafter as intermediate part 22.

Figure 3:
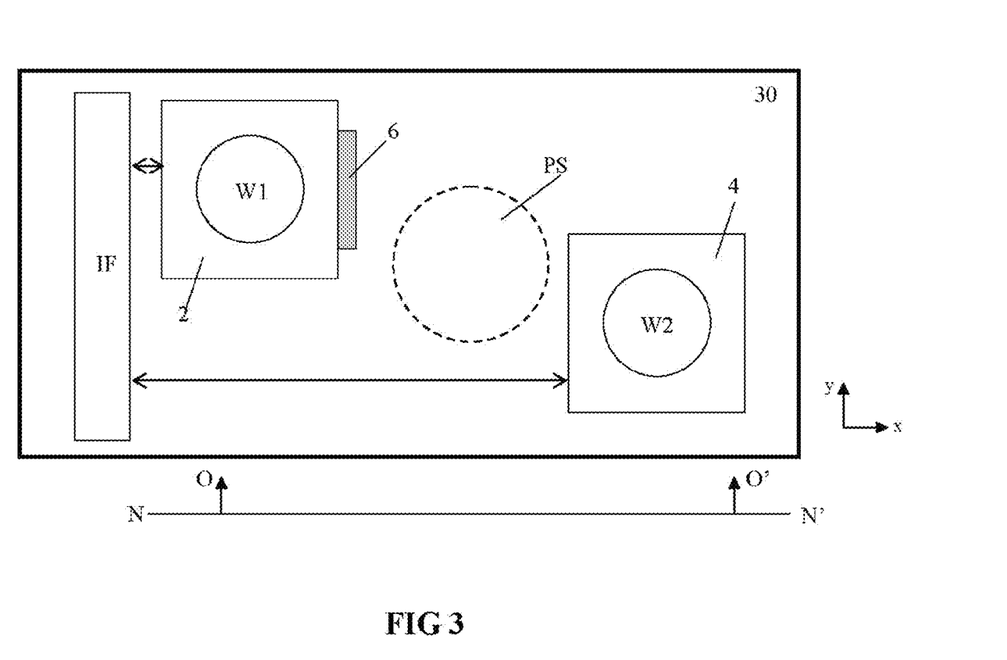
FIG. 3 depicts part of the lithographic apparatus of FIG. 1 in top view according to the arrows MM' directed towards the plane indicated by the line LL', in a first configuration.

FIG. 3 depicts part of the lithographic apparatus of FIG. 1 in top view according to the arrows MM' directed towards the plane indicated by the line LL', including two stages, 2 and 4 configured to hold the substrates W1 and W2. FIG. 5 depicts, in side view according to the arrows OO' in FIG. 3 with regard to the line NN', each stage provided with a short stroke module, 20.1 and 20.2 configured to move the tables WT1 and WT2 holding the substrates W1 and W2. FIG. 5 further depicts long stroke modules 18.1 and 18.2 to move the short stroke modules 20.1 and 20.2. The lithographic apparatus is provided with a swap bridge 6 to couple the stages 2 and 4, wherein, in a first situation or configuration as shown in FIG. 3 the stages 2 and 4 are moveable with respect to each other. In a second situation or configuration, depicted in FIG. 4, the stages 2 and 4 are coupled via the swap bridge 6 to make a joint movement, for example in the direction of the arrow JM. In FIG. 5, the depicted part of the lithographic apparatus shows a bridge holder 16 configured to hold the swap bridge 6 in the first situation, wherein the bridge holder 16 is isolated dynamically from the moveable parts 14 of the short stroke modules 20.1 and 20.2. The lithographic apparatus is further provided with a system configured to take the swap bridge 6 from the bridge holder 16 and to make a coupling between the moveable part 14 of the short stroke modules 20.1 and 20.2 with the swap bridge 6 such that, in use, in the second situation, the swap bridge 6 is only coupled with the moveable part 14 of the short stroke modules 20.1 and 20.2. This system can be termed hereinafter a coupler.

It is known in the art that the stationary part 12 of the short stroke module 20 can be isolated dynamically from the moveable part 14. This can be done, for example, by using a Lorentz motor. With this type of motor, there is an electromagnetic contact and no mechanical contact between the stationary and the moveable part of the motor. Therefore, dynamical vibrations from the stationary part can not propagate, to a large extent, to the moveable part and vice versa.

According to FIG. 5, the bridge holder 16 is directly or indirectly coupled to the moveable part 10 of the long stroke module 18.1. The bridge holder 16 can indirectly be coupled to the moveable part 10 via the stationary part 12 of the short stroke module 20 and/or via one or more additional components connected to the moveable part 10 or the stationary part 12. However, it is also possible that the bridge holder 16 be connected to a stationary part of the lithographic apparatus, for example the projection lens PS or the support frame 30 that supports the long stroke modules 18.1 and 18.2.

Figure 8:
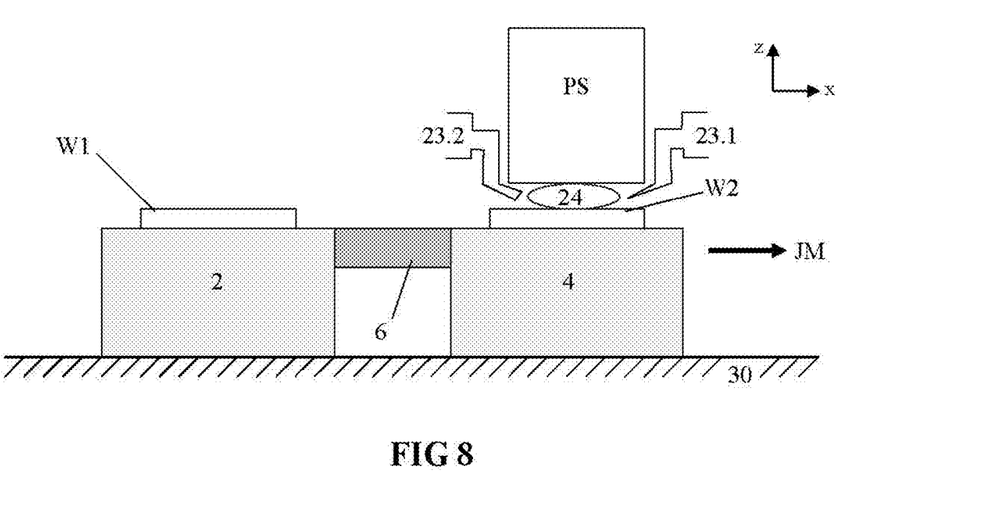
FIG. 8 depicts part of an embodiment of a lithographic apparatus provided with an immersion liquid, during the swap of a substrate.

The lithographic apparatus can be provided with an immersion system. In an embodiment, schematically depicted in FIG. 8, an immersion system 23 applies a liquid 24 between the substrate W2 and the projection lens PS via an inlet 23.1 to a localized area on the substrate W2. Liquid that is flowing from the localized area is removed through outlet 23.2. FIG. 8 depicts the second situation, wherein the stages 2 and 4 are coupled by the swap bridge 6. The stages 2 and 4 can move together in a joint movement in the direction of the arrow JM. When moving in the direction JM, substrate W2 is moved away from beneath the projection system PS and substrate W1 is moved beneath the projection system PS. Exchanging one substrate beneath the projection system PS for another is referred to as swapping. During the swap of substrates, it is preferable to continue the flow of liquid 24. This can help to avoid drying stains on the projection system PS. It is desirable to prevent leakage into the lithographic apparatus which may result in damage and contamination. The swap bridge 6 can contribute to prevent leakage of the liquid 24 between the stages 2 and 4 during a swap by providing a boundary for the liquid 24.

Figure 9:
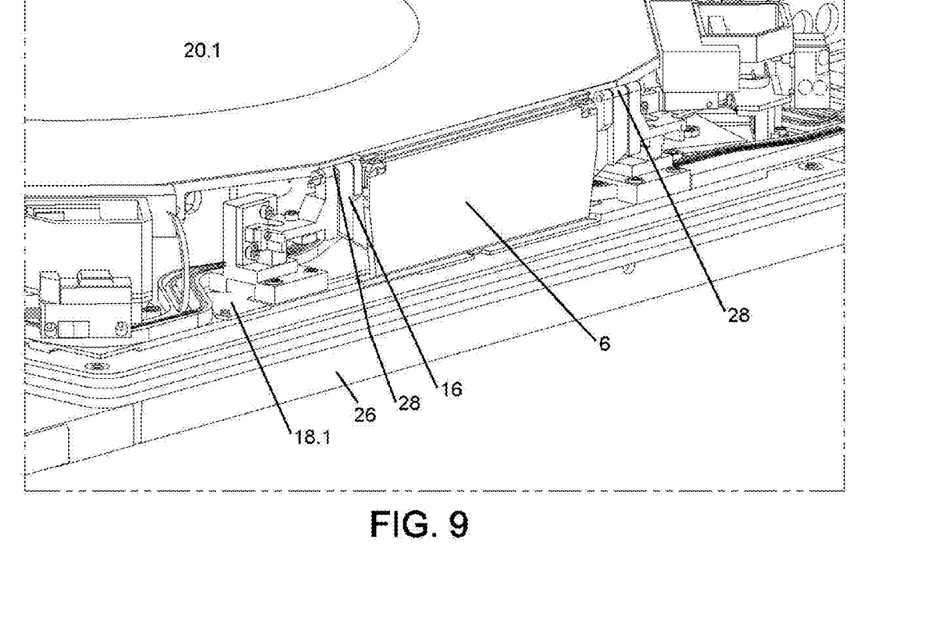
FIG. 9 depicts an embodiment wherein the swap bridge is in a first position, in which the swap bridge is protected by a bumper so as to prevent it from colliding with another part of the lithographic apparatus.
Figure 10:
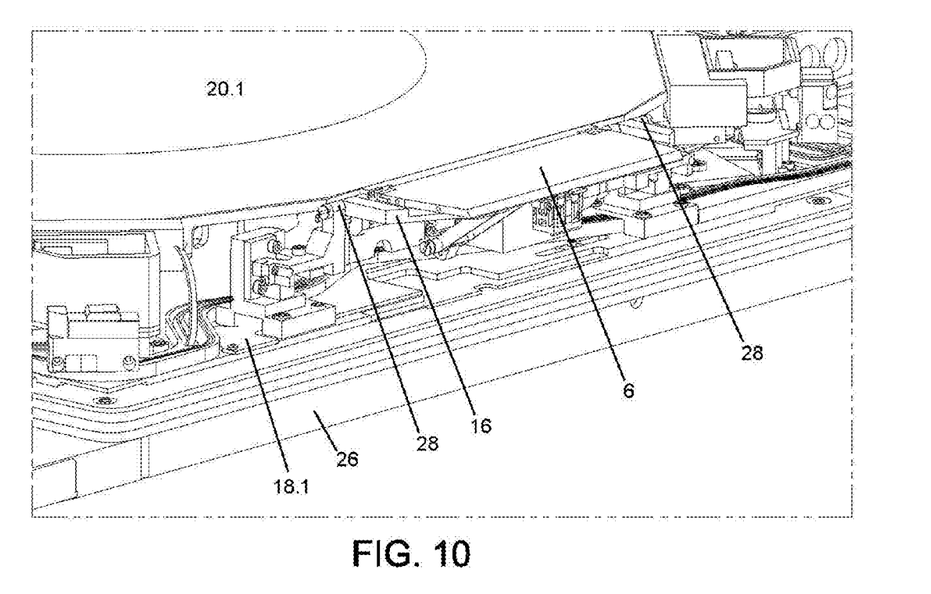
FIG. 10 depicts the embodiment of FIG. 9 wherein the swap bridge is in a second position, in which the swap bridge can be taken from the bridge holder and can be coupled to the moveable part of the short stroke modules.

FIG. 9 shows an embodiment wherein the bridge holder 16 is configured to hold the swap bridge 6 in a first position such that the swap bridge 6 is prevented from colliding with another part of the lithographic apparatus. In the first position, the swap bridge 6 is protected by a bumper 26 to prevent the swap bridge from colliding with another part of the lithographic apparatus. The embodiment is provided with a system or coupler configured to take the swap bridge 6 from the bridge holder 16 and to make a coupling between the moveable part 14 of the short stroke modules 20.1 and 20.2 with the swap bridge 6. In this embodiment the system or coupler includes a controller, a motor and hinges 28. The controller is configured to control the motor which can rotate the swap bridge 6 by using hinges 28 between the intermediate part 22 and the bridge holder 16. The swap bridge 6 is held by the bridge holder 16, so by rotating the bridge holder 16, the swap bridge 6 can be rotated in a second position as shown in FIG. 10. In the second position, it is possible for the short stroke modules 20.1 and 20.2 to couple to the swap bridge 6 and to release it from the bridge holder 16. In another embodiment the coupler includes one hinge.

In another embodiment, the coupler configured to couple the moveable parts 14 of the short stroke modules 20.1 and 20.2, include a robot arm configured to take the swap bridge 6 from the bridge holder 16 and, then, to move the swap bridge 6 to a position where the swap bridge 6 can be coupled to the moveable parts 14 of the short stroke modules 20.1 and 20.2 of the stages 2 and 4.

Figure 7:
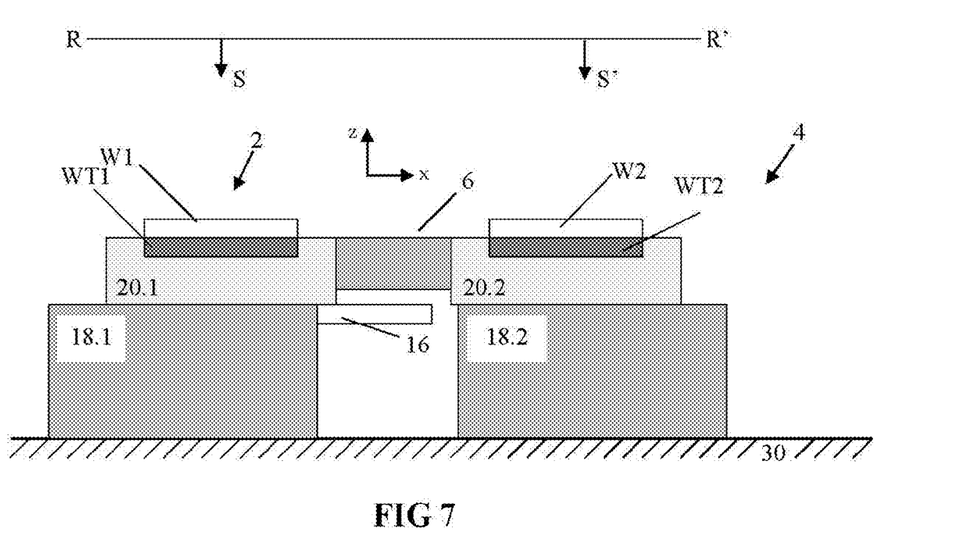
FIG. 7 depicts, in side view according to the arrows QQ' in FIG. 4 with regard to the line PP', the lithographic apparatus in the second configuration in which the stages are coupled to each other by the swap bridge.
Figure 11:
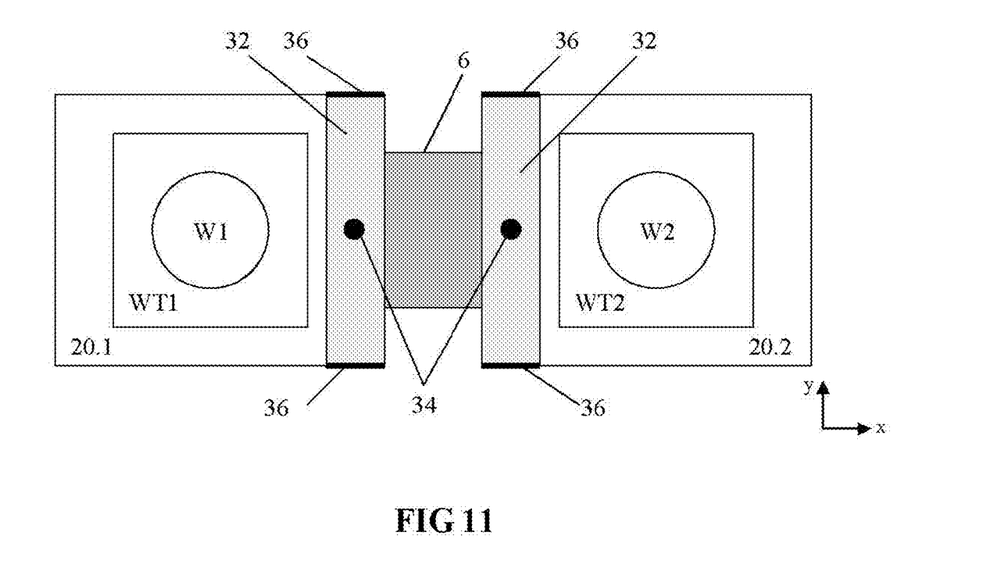
FIG. 11 depicts, according to the line RR' in FIG. 7 in the direction of arrows SS', the lithographic apparatus provided with two bridgeheads configured to couple the swap bridge.

FIG. 11 depicts, according to the line RR' in FIG. 7 in view of the direction of arrows SS', the lithographic apparatus provided with two bridgeheads 32 configured to couple the swap bridge 6 to the moveable parts 14 of the short stroke modules 20.1 and 20.2 such that deformations of the short stroke modules 20.1 and 20.2 and/or swap bridge 6 are at least partly isolated from each other. This means that, for example, effects of thermal expansion of the short stroke modules 20.1 and 20.2 and/or bridgeheads 32 are minimized by the dynamical characteristics of the bridgeheads 32 and if possible flexible characteristics of the bridgeheads 32, for example the way in which the bridgeheads 32 are coupled to the short stroke module 20.1 and 20.2.

In the embodiment of FIG. 11, each bridgehead 32 is connected to the moveable part 14 of the short stroke module 20.1 or 20.2 via leaf springs 36 which are flexible in y-direction and via a central support 34 which constrains the bridgehead 32 in the y-direction. Because each bridgehead 32 is constrained in the y-direction only at one location, the bridgeheads 32 and the moveable parts 14 of the short stroke modules 20.1 and 20.2 can expand and shrink freely relative to each other in y-direction. This means that in case the moveable parts 14 of the short stroke modules 20.1 and 20.2 deform in the y-direction, the swap bridge 6 coupled to the bridgeheads 32 is not deformed and vice versa. As a result, the deformations of the short stroke modules 20.1 and 20.2 and/or the swap bridge 6 are at least partly isolated from each other. These deformations can be caused by thermal expansion, accelerations forces or pressure caused by liquid 24. Other configurations to connect the bridgeheads 32 to the moveable parts 14 of the short stroke modules 20.1 and 20.2 are possible. For example, a bridgehead 32 can be constrained by only two leaf springs 36, one of which is stiffened in the y-direction to constrain the bridgehead 32 in the y-direction. It is also possible that the bridgeheads 32 are mounted to the swap bridge 6. Further, the lithographic apparatus can be provided with only one bridgehead 32.

It is known in the art to use materials with the same thermal coefficient of expansion for components that are connected to each other in order to minimize deformation caused by thermal expansion. However, because the moveable parts 14 of the short stroke modules 20.1 and 20.2 and bridgeheads 32 can expand and shrink freely relative to each other in the y-direction, as shown in the embodiment in FIG. 11, materials with a different thermal coefficient of expansion can be used without increasing the deformation caused by thermal expansion. For the bridgeheads 32, a first material with a high resistance to wear can be used such as a hard metal, so the swap bridge 6 can be repeatedly coupled and uncoupled without wearing the bridgeheads 32. The moveable parts 14 of the short stroke modules 20.1 and 20.2 can include a second material with a lower thermal coefficient of expansion than that of the first material, such as zerodur, to achieve a thermally stable shape.

Figure 4:
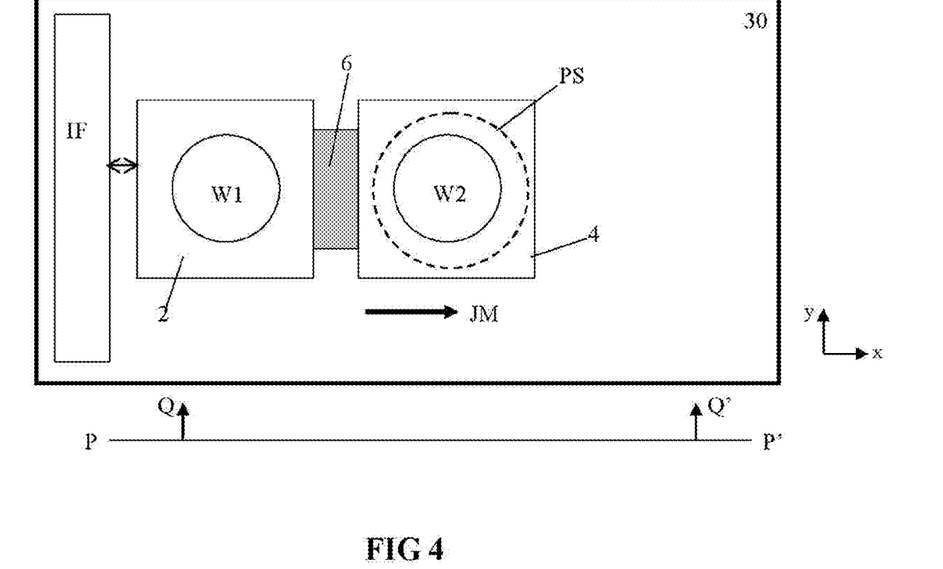
FIG. 4 depicts part of the lithographic apparatus of FIG. 1 in a second configuration.
Figure 5:
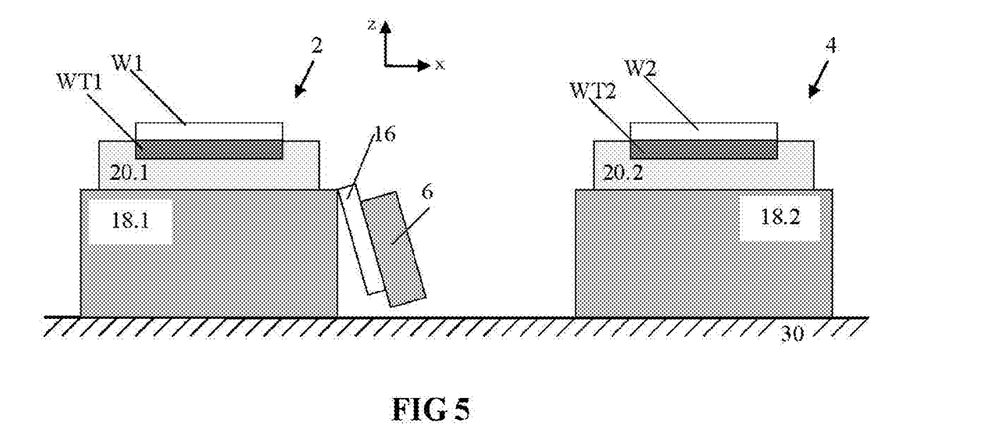
FIG. 5 depicts in side view according to the arrows OO' in FIG. 3 with regard to the line NN', the lithographic apparatus in the first configuration in which the stages can move relative to each other.
Figure 6:
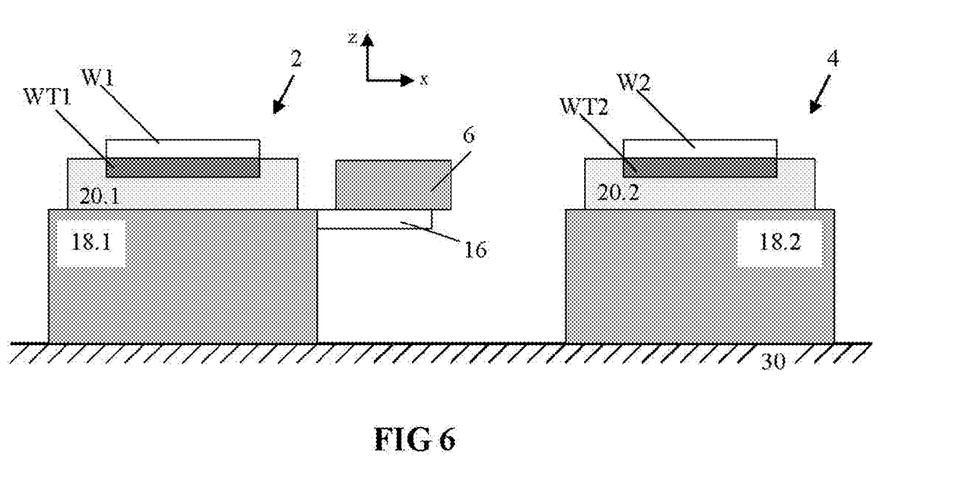
FIG. 6 depicts the swap bridge in a position in which it can be coupled to the stages.
Figure 12:
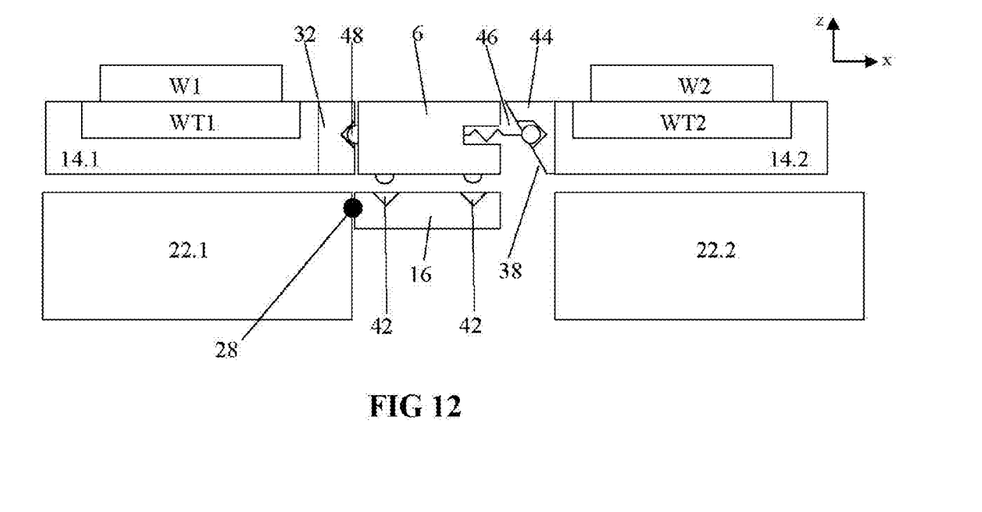
FIG. 12 shows the lithographic apparatus in a view according to the line PP' in the direction of arrows QQ' depicted in FIG. 4, wherein the lithographic apparatus is provided with a system configured to uncouple the swap bridge and move the bridge holder.
Figure 13:
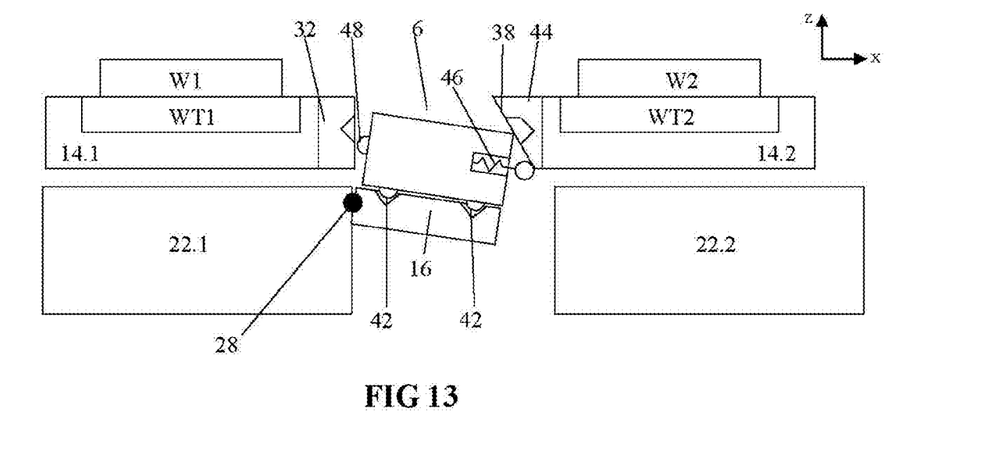
FIG. 13 depicts the embodiment of FIG. 12 in which the moveable parts of the short stroke modules are positioned too close to each other for the swap bridge 6 to remain coupled.

FIGS. 12 and 13 show the lithographic apparatus in a view according to the line PP' in the direction of arrows QQ' depicted in FIG. 4. The moveable part 14.1 of short stroke module 20.1 is provided with bridgehead 32 which has a V-groove to couple with the coupling 48 connected to the swap bridge 6. The moveable part 14.2 of the short stroke module 20.2 is provided with a bridgehead 44 that includes an oblique surface 38 and a V-groove to couple with flexible coupling 46 that is flexible in the x-direction and is connected to the swap bridge 6. The bridge holder 16 is provided with V-grooves 42 to hold the swap bridge 6, and is connected to intermediate part 22.1 via hinge 28 that can rotate the bridge holder 16 with regard to intermediate part 22.1 along the y-axis. The swap bridge 6 is pressed upon by the moveable parts 14.1 and 14.2 in the x-direction, causing the coupling 48 to be fastened to the V-groove of bridgehead 32 and causing the flexible coupling 46 to be fastened to the V-groove of bridgehead 44. This way the swap bridge 6 is coupled to the moveable parts 14.1 and 14.2. The flexible coupling 46 helps to minimize variations of the pressing force caused by variations in the distance between the moveable parts 14.1 and 14.2. These variations in distance can be caused by position errors of the moveable parts 14.1 and 14.2. This way the swap bridge 6 can be coupled using a substantially constant predetermined pressing force.

To uncouple the swap bridge 6, the moveable parts 14 of the short stroke modules 20.1 and 20.2 are first lowered to place the swap bridge 6 onto the bridge holder 16, and then moved away from each other to reduce the pressing force on the swap bridge 6 and finally to uncouple the swap bridge 6.

A benefit of the embodiment according to FIGS. 12 and 13 is that it is provided with a safety measure which uncouples the swap bridge 6 from the moveable parts 14 of the short stroke modules 22.1 and 22.2 by moving the moveable parts of the short stroke modules 22.1 and 22.2 toward each other, the bridge holder 16 being constructed to capture the swap bridge 6 after the swap bridge has been uncoupled. FIG. 13 depicts an exceptional situation in which the swap bridge 6 is coupled to the moveable parts 14.1 and 14.2 of the short stroke modules 20.1 and 20.2, but the moveable parts 14.1 and 14.2 are positioned too close to each other for the swap bridge 6 to remain coupled. To uncouple the swap bridge 6, the lithographic apparatus is provided with a system or uncoupler configured to uncouple the swap bridge 6 by moving the moveable parts 14.1 and 14.2 of the short stroke modules 20.1 and 20.2 toward each other. In this embodiment, the system or uncoupler includes the oblique surface 38 and the flexible coupling 46. To uncouple the swap bridge 6, the oblique surface 38 of the bridgehead 44 presses the swap bridge 6 downward. As the swap bridge 6 is pressed downward, the flexible coupling 46 is compressed and is able to uncouple from the V-groove in bridgehead 44. As a result, the swap bridge 6 falls down because of gravity, and is captured by the bridge holder 16 after the swap bridge has been uncoupled by using the V-grooves 42. In case the distance between the moveable parts 14.1 and 14.2 becomes even smaller, the oblique surface 38 causes the bridge holder 16 to rotate around hinge 28 by pressing via the swap bridge 6 on the bridge holder 16. By uncoupling and pressing away the swap bridge 6 with or without the bridge holder 16 in the exceptional situation depicted in FIG. 13, damage to the lithographic apparatus can be prevented. Reasons for the moveable parts 14.1 and 14.2 being too close to each other can be a malfunction of a position controller of one of the moveable parts 14.1 and 14.2 or loss of electrical power to one of the stages 2 and 4. Alternatively to the embodiment depicted in FIG. 13, the oblique surface 38 is an integrated part of the moveable part 14 of one of the short stroke modules 20.1 and 20.2, or of one of the substrate tables WT1 and WT2. The bridgeheads 32 and 44 can be provided with the system to at least partly isolate deformations of the short stroke modules 20.1 and 20.2 and/or the swap bridge 6 from each other, as described in the embodiment depicted in FIG. 11. It is possible to provide the swap bridge 6 with an oblique surface. In another embodiment, the oblique surface 38 presses the swap bridge 6 in another direction than downward, for example sideward. It is possible for the bridge holder 16 to be translatable. The flexible coupling 46 can be stiff in another direction than the x-direction, for example in z-direction so it can be used to resist the pressure provided by the liquid 24 to the swap bridge 6. This can reduce the deformation of the swap bridge 6 when the liquid 24 passes the swap bridge 6. Instead of the oblique surface 38 and the flexible coupling 46, it is also possible to provide the lithographic apparatus with other means for uncoupling the swap bridge and moving the bridge holder, by moving the moveable parts 14 of the short stroke modules 20.1 and 20.2 toward each other, such as a weak coupling between the swap bridge 6 and the bridgeheads 32 and 44 that can break to uncouple the swap bridge 6. In another embodiment coupling 48 is connected to bridgehead 32 and/or flexible coupling 46 is connected to bridgehead 44 and the swap bridge 6 is provided with V-grooves. It is also possible that the swap bridge 6 be provided with V-grooves for being held by the bridge holder 16. It will be appreciated by someone skilled in the art that other types of grooves can be used.

In an embodiment the bridge holder 16 is provided with a magnet to hold the swap bridge 6. The swap bridge 6 can be released from the bridge holder 16 by applying a force to the swap bridge 6 that exceeds the magnetic holding force provided by the magnet. In another embodiment, the swap bridge 6 is provided with a magnet.

In an embodiment, the lithographic apparatus is provided with extraction holes to extract part of the liquid 24. The extraction holes can be provided to the swap bridge 6 and/or one of the bridgeheads 32 and 44 and/or to the moveable part 14 of one of the short stroke modules 20.1 and 20.2.

In an embodiment of the invention, stages 2 and 4 each are provided with a bridge holder 16 for holding a swap bridge 6, one for each bridge holder.

In an embodiment of the invention, one of short stroke modules 20.1 and 20.2 is provided with a sensor table instead of substrate table WT1 or WT2. The sensor table may be provided with sensors and may not be able to support a substrate. The sensors may be used, for example, to align the sensor table with regard to the projection system PS, or to measure a property of the radiation beam passing through the projection system PS, such as magnification or intensity. In a configuration as shown in FIG. 8, the sensor table may be used to help preventing undesired leakage of liquid 24 by acting as a boundary for the liquid 24, for example similar as substrate W2 in FIG. 8.

In an embodiment there is provided a lithographic apparatus including a first and a second stage that are each configured to hold a substrate. Each of the first and the second stage are provided with a short stroke module and a long stroke module configured to move the short stroke module of the stage. The lithographic apparatus is further provided with a swap bridge configured to couple the first and the second stage, wherein, in use, in a first configuration, the first and the second stage are moveable with respect to each other. In a second configuration, the first and the second stage are coupled via the swap bridge for joint movement. The lithographic apparatus is further provided with a bridge holder configured to hold the swap bridge in the first configuration, wherein the bridge holder is dynamically isolated from a moveable part of the short stroke module of the first and the second stage. The lithographic apparatus is further provided with a coupler configured to couple the moveable part of the short stroke module of the first and the second stage with the swap bridge such that, in use, in the second configuration, the swap bridge is only coupled with the moveable part of the short stroke module of the first and the second stage.

The bridge holder may be directly coupled to the moveable part of the long stroke module of the first or the second stage. The bridge holder may be configured to hold the swap bridge in a first position such that the swap bridge is prevented from colliding with another part of the lithographic apparatus.

The lithographic apparatus may further include a hinge arranged between the moveable part of the long stroke module of the first stage and the bridge holder such that the swap bridge can be rotated from the first position to a second position by the hinge.

The lithographic apparatus may further include a bridgehead configured to couple the swap bridge to the moveable part of the short stroke module of the first or the second stage such that deformations of the short stroke module and/or swap bridge are at least partly isolated from each other.

The lithographic apparatus may further include an uncoupler configured to uncouple the swap bridge from a moveable part of the short stroke module of the first and the second stage by moving the moveable part of the short stroke modules of the first and the second stage toward each other. The bridge holder may be constructed to capture the swap bridge after the swap bridge has been uncoupled.

In an embodiment there is provided a device manufacturing method including coupling a first and a second stage with a swap bridge. The first and the second stage are each configured to hold a substrate. Each of the first and the second stage are provided with a short stroke module and a long stroke module configured to move the short stroke module of the stage. In use, in a first configuration, the first and the second stage are moveable with respect to each other. In a second configuration, the first and the second stage are coupled via the swap bridge for joint movement. The method further includes holding the swap bridge with a bridge holder in the first configuration, wherein the bridge holder is dynamically isolated from a moveable part of the short stroke module of the first and the second stage. The method further includes coupling the moveable part of the short stroke module of the first and the second stage with the swap bridge such that, in use, in the second configuration, the swap bridge is only coupled with the moveable part of the short stroke module of the first and the second stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies, a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a first and a second stage that are each configured to hold a substrate, each of the first and the second stage being provided with a short stroke module and a long stroke module configured to move the short stroke module of the stage;
   a swap bridge configured to couple the first and the second stage, wherein, in use, in a first configuration, the first and the second stage are moveable with respect to each other, and wherein, in a second configuration, the first and the second stage are coupled via the swap bridge for joint movement;
   a bridge holder configured to hold the swap bridge in the first configuration, wherein the bridge holder is dynamically isolated from a moveable part of the short stroke module of the first and the second stage; and
   a coupler configured to couple the moveable part of the short stroke module of the first and the second stage with the swap bridge such that, in use, in the second configuration, the swap bridge is only coupled with the moveable part of the short stroke module of the first and the second stage.

2. The lithographic apparatus of claim 1, wherein the bridge holder is directly coupled to the moveable part of the long stroke module of the first or the second stage.

3. The lithographic apparatus of claim 1, wherein the bridge holder is configured to hold the swap bridge in a first position such that the swap bridge is prevented from colliding with another part of the lithographic apparatus.

4. The lithographic apparatus of claim 3, further comprising a hinge arranged between the moveable part of the long stroke module of the first stage and the bridge holder such that the swap bridge can be rotated from the first position to a second position by the hinge.

5. The lithographic apparatus of claim 1, further comprising a bridgehead configured to couple the swap bridge to the moveable part of the short stroke module of the first or the second stage such that deformations of the short stroke module and/or swap bridge are at least partly isolated from each other.

6. The lithographic apparatus of claim 1, comprising an uncoupler configured to uncouple the swap bridge from a moveable part of the short stroke module of the first and the second stage by moving the moveable part of the short stroke modules of the first and the second stage toward each other, the bridge holder being constructed to capture the swap bridge after the swap bridge has been uncoupled.

7. A device manufacturing method comprising:
   coupling a first and a second stage with a swap bridge, the first and the second stage being each configured to hold a substrate, each of the first and the second stage being provided with a short stroke module and a long stroke module configured to move the short stroke module of the stage, wherein, in use, in a first configuration, the first and the second stage are moveable with respect to each other, and wherein, in a second configuration, the first and the second stage are coupled via the swap bridge for joint movement;
   holding the swap bridge with a bridge holder in the first configuration, wherein the bridge holder is dynamically isolated from a moveable part of the short stroke module of the first and the second stage; and
   coupling the moveable part of the short stroke module of the first and the second stage with the swap bridge such that, in use, in the second configuration, the swap bridge is only coupled with the moveable part of the short stroke module of the first and the second stage.

* * * * *